United States Patent
Yamazaki et al.

(10) Patent No.: US 7,061,090 B2
(45) Date of Patent: Jun. 13, 2006

(54) SEMICONDUCTOR DEVICE

(75) Inventors: Misuk Yamazaki, Kashiwa (JP); Tatsuo Yamazaki, Tomobe (JP)

(73) Assignee: Hitachi, Ltd., Tokyo (JP)

( * ) Notice: Subject to any disclaimer, the term of this patent is extended or adjusted under 35 U.S.C. 154(b) by 121 days.

(21) Appl. No.: 10/382,926

(22) Filed: Mar. 7, 2003

(65) Prior Publication Data

US 2003/0168722 A1    Sep. 11, 2003

(30) Foreign Application Priority Data

Mar. 8, 2002    (JP)    ............... 2002-062816

(51) Int. Cl.
*H01L 23/48* (2006.01)
*H01L 23/34* (2006.01)

(52) U.S. Cl. .................. 257/688; 257/689; 257/693; 257/658; 257/712

(58) Field of Classification Search ............... 257/688, 257/689, 693, 658, 712
See application file for complete search history.

(56) References Cited

U.S. PATENT DOCUMENTS

| 5,005,069 A | * | 4/1991 | Wasmer et al. ............. 257/687 |
| 5,886,403 A | * | 3/1999 | Yoshinaga et al. .......... 257/688 |

FOREIGN PATENT DOCUMENTS

| JP | 4-229639 | 8/1992 |
| JP | 10-215552 | 8/1998 |
| JP | 11-243165 | 9/1999 |

* cited by examiner

*Primary Examiner*—Steven Loke
*Assistant Examiner*—Samuel Bebremariam
(74) *Attorney, Agent, or Firm*—Antonelli, Terry, Stout and Kraus, LLP.

(57) ABSTRACT

A semiconductor device comprises a semi-conductor chip bonded on a top surface inside a case electrode by a bonding material and a lead electrode bonded on a top surface of the semiconductor chip by a bonding material with a space of the case electrode filled with an insulating material for sealing the bonded sections, wherein a groove is provided on a top surface of the case electrode from an edge of the semiconductor chip, to thereby reduce heat distortion which is generated on a large scale at an end of the bonding material on account of a difference in coefficients of linear thermal expansion between the semiconductor chip and the case electrode and improve the thermal fatigue life.

14 Claims, 5 Drawing Sheets

SEMICONDUCTOR DEVICE

BACKGROUND OF THE INVENTION

The present invention relates to a semiconductor device, and more particularly, to a semiconductor device that converts an AC output of an AC generator to a DC output.

With regard to a rectification device for an AC generator, in order to obtain a semiconductor device whose electrical characteristics will not deteriorate for a long period of time, even in a severe environment in which a large number of thermal shocks are repeatedly applied, JP-A-4-229639 proposes a structure in which a semiconductor chip is encapsulated with an epoxy-based insulating material. This encapsulated structure is intended to secure a necessary current-carrying path by utilizing contraction of the resin after molding to apply a pressure, in a direction perpendicular to a bonded plane of a semiconductor chip, to a case electrode even if cracking occurs in a bonding material for the case electrode and semiconductor chip. Furthermore, as a similar invention, JP-A-10-215552 proposes a structure in which a groove is provided around a semiconductor chip. The groove is filled with an insulating resin material at a high pressure exceeding an atmospheric pressure, and is then molded in such a way that a residual compressive stress is produced in the insulating resin material.

When a semiconductor device is mounted in a location such as an engine compartment of an automobile, there is quite a large influence such as high temperatures and an increase in an amount of heat produced by a generator due to variations of electric load on a vehicle side. Especially, automobiles present a severe environment subject to repetitive cooling and heating extending over a wide temperature range caused by temperature differences between summer and winter, etc. Therefore automobiles require semiconductor devices having an excellent heat radiation characteristics and thermal fatigue resistances.

When a semiconductor device repeatedly receives a large number of heat shocks, distortion caused by a difference in coefficients of linear thermal expansion among the components making up the semiconductor device is applied to its bonding material (for example, solder). If sufficient counter measures are not provided, cracks may occur in this bonding material. Once cracks occur, a cross-sectional area of the bonding material that constitutes a current-carrying path is reduced and electrical resistance increases. As a result, heat generation is increased and an amount of heat radiation through the bonding material is reduced. Accordingly, temperature of the semiconductor chip tends to abnormally increase. Thus, if the temperature reaches a point of melting of the bonding material, or if the semiconductor chip reaches a limit of heat resistance, the rectification function may be lost.

The inventors of the present invention have found that the structures described in the above-mentioned publications are not sufficient in order to obtain semiconductor devices which can fully cope with such an operating environment and effectively achieves improvement of thermal fatigue life and heat radiation characteristics.

According to the structure described in JP-A-4-229639, it is possible to suppress abnormal temperature rises of a semiconductor chip to a certain degree by suppressing an increase of electrical resistance, and to support the amount of heat generation by securing a current-carrying path. However, this resin-encapsulated structure is only intended to apply a pressure to the case electrode by utilizing contraction of the resin after molding, and, therefore is not originally intended to reduce distortion of the bonding material caused by differences in coefficients of linear thermal expansion. Therefore, the structure has a certain degree of effectiveness in extending service life, but cannot totally solve the problem of generation of distortion of the bonding material.

In the structure described in JP-A-10-215552, there is no reduction of elastic modulus of the insulating resin material even at a high temperature (140° C.). Therefore, it is possible to prevent reduction of the effect of suppressing free expansion of the case electrode due to reduction of the elastic modulus. However, there is a problem of the life of the insulating resin material itself, such as deterioration of the insulating material, since the rigidity of the insulating resin material is high. Furthermore, since the semiconductor chip is located in a place higher than the radiating fins of the structure, it results in high heat resistance and insufficient heat radiation characteristics.

JP-A-11-243165 discloses a structure provided with a ring-shaped groove having a dovetail cross section near a center between a semiconductor chip and a wall inside a concave support electrode (case electrode). The groove is assumed to be placed near the center between the semiconductor chip and the wall in order to assist in preventing the resin filled in the concave support electrode from separating from the support electrode.

Thus, it is an object of the present invention to provide a semiconductor device capable of preventing cracking in a semiconductor chip caused by a difference in mutual thermal deformation between a case electrode and a semiconductor chip electrically bonded together by using a bonding material, as well as being capable of reducing distortion of the bonding material and improving a heat radiation characteristic of the semiconductor chip.

BRIEF SUMMARY OF THE INVENTION

In order to solve the above-described problems, the present invention provides a semiconductor device comprising a semiconductor chip bonded on a top surface inside a case electrode by a bonding material and a lead electrode bonded on a top surface of the semiconductor chip by a bonding material with a space of the case electrode filled with an insulating material for sealing the bonded sections. A groove is provided on a top surface of the case electrode from an edge of the semiconductor chip, to thereby reduce heat distortion which is generated on a large scale at an end of the bonding material on account of a difference in coefficients of linear thermal expansion between the semiconductor chip and the case electrode, and to improve the thermal fatigue life.

According to a first aspect of the invention, there is provided a semiconductor device comprising: a lead electrode for connecting with a lead; a case electrode having a convex wall section at a periphery thereof; and a semiconductor chip having a rectification function placed between the lead electrode and the case electrode and bonded them by a bonding material. The case electrode includes, in an area between an edge of the semiconductor chip and the convex wall section, a first area which is thinner than the thickness of an area of the case electrode on which the semiconductor chip is placed and a second area for which the thickness is thicker than that of the first area. The first area is formed so as to have a width extending within a distance five times the thickness of the bonding material bonding the semiconductor chip to the case electrode from the edge of the semiconductor chip.

When a semiconductor is a polygonal shape, it is preferable that a first distance between a first edge of the semiconductor chip and a corresponding first end of the first area is smaller than a second distance between a second edge of the semiconductor chip and a corresponding second end of the first area. It is also preferable that the second distance is not more than 5 times the thickness of the bonding material bonding the semiconductor chip to the case electrode.

If the first area of the case electrode, that is, the groove, is not provided, and the semiconductor chip is bonded to the case electrode through the bonding material, the bonding material sticks out of the edge of the semiconductor chip toward the convex wall section of the case electrode and bonding length between the bonding material and the case electrode becomes longer. As a result, thermal deformation of the bonding material effected by the case electrode becomes large and thermal distortion of the bonding material due to the difference in thermal expansion between the semiconductor chip and the case electrode becomes large, particularly, at the edge of the bonding material.

In the invention, however, a first area, that is, a groove which extends from the edge of the semiconductor chip is provided. Therefore, the bonding material cannot stick out of the edge of the semiconductor chip toward the convex wall section and the length of the bonding material becomes the same as the case electrode. Thus, thermal distortion of the bonding material caused by the case electrode becomes small, and the thermal fatigue life can be extended.

Further, the first area or groove can absorb stress which may occur when the case electrode is mechanically fixed to a heat radiation plate Therefore, it is possible to reduce the stress which is applied to the semiconductor chip.

The area of said case electrode on which said semiconductor chip is placed may be positioned at a level not higher than the convex wall section.

With this structure, the heat radiation performance is improved.

The width of the first area may be not less than 50% of the thickness of the bonding material bonding the semiconductor chip to the case electrode.

The width of the first area may be not more than 90% of a distance from a position of the case electrode corresponding to an outer edge of the semiconductor chip which is the closest to the convex wall section toward the convex wall section.

A depth of the first area of the case electrode may be not less than 30% of the thickness of the area of the case electrode on which the semiconductor chip is placed.

A height of a part of the convex wall section in contact with a heat radiation plate, which is placed peripheral to the semiconductor device, may be not more than a thickness of the heat radiation plate.

With this structure, it is possible to prevent the semiconductor device from dropping out of the heat radiation plate by external shock.

It is preferable that the semiconductor device further comprises an insulating material made of a soft rubber material and filled in an area surrounded by the convex wall section of the case electrode.

Since the rigidity of the insulating material itself is low, it is possible to suppress the stress which is applied to the semiconductor chip due to deformation of the case electrode when the case electrode is mechanically fixed to the heat radiation plate.

It is preferable that the case electrode comprises zircon copper.

The zircon copper has a yield stress value higher than the pure copper. Therefore, it is possible to reduce an influence of deformation of the case electrode on deformation of the semiconductor chip when the case electrode is mechanically fixed to the heat radiation plate.

According to another aspect of the invention, there is provided a semiconductor device comprising: a lead electrode for connecting with a lead; a semiconductor chip having a rectification function placed on the lead electrode through a bonding layer; and a case electrode placed under the semiconductor chip through a bonding material. The case electrode includes a convex wall section surrounding a periphery thereof, an area formed inside the convex wall section, on which the semiconductor chip is placed, a first area formed outside the area on which the semiconductor chip is placed, and having a thickness which is thinner than that of the area on which the semi-conductor chip is placed, and a second area formed between the first area and the convex wall section. The thickness of the second area is thicker than that of the first area, and a distance between an edge of the semiconductor chip which is the closest to the convex wall section and the first area is not more than five times a thickness of the bonding layer bonding the semiconductor chip to the case electrode.

DETAILED DESCRIPTION OF THE INVENTION

With reference to the drawings, embodiments of the present invention will be described hereinafter.

Figure 1:
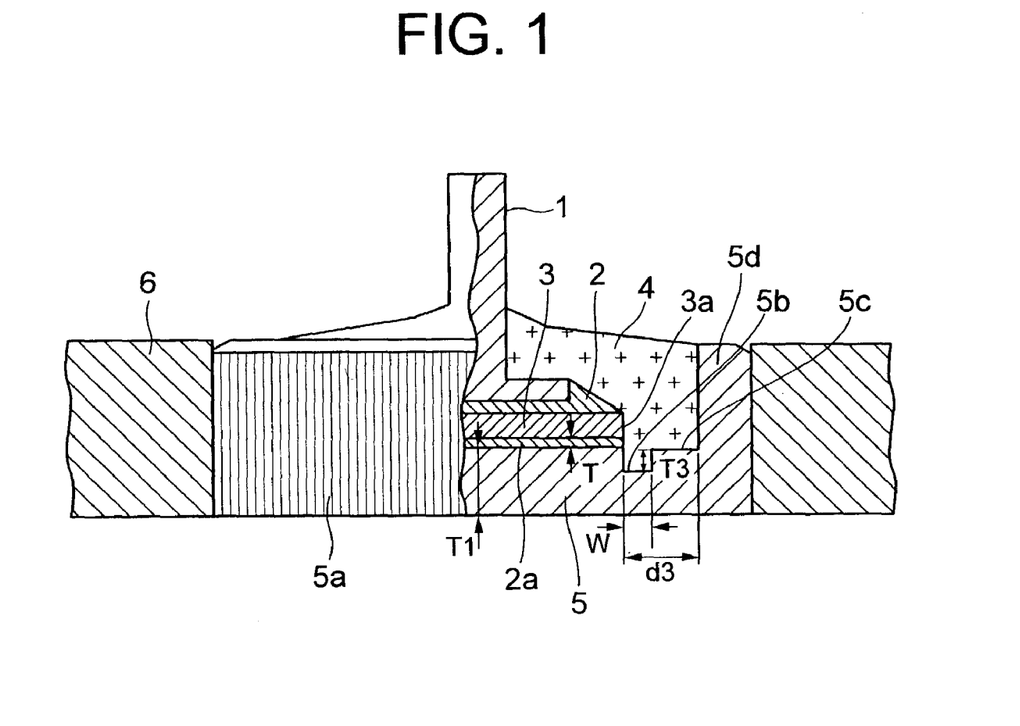
FIG. 1 is a vertical sectional view of a main part of a first embodiment of a semiconductor device according to the present invention.
Figure 2:
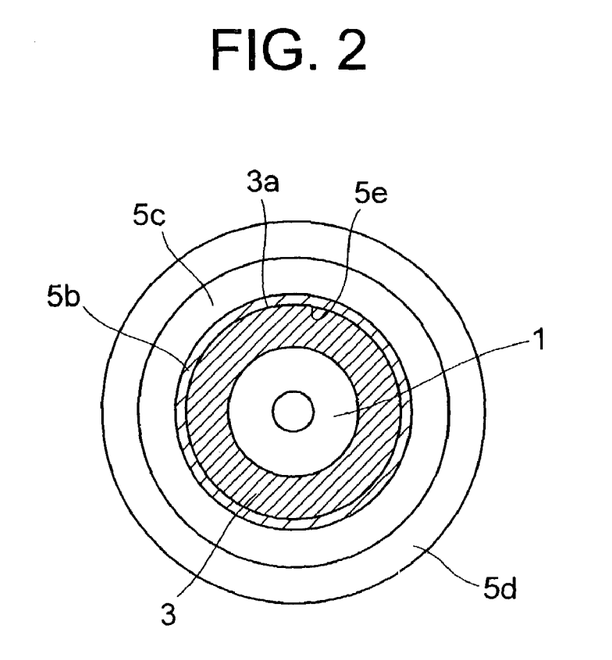
FIG. 2 is a top view of the first embodiment of the present invention in which a shape of the semiconductor chip is circular.

A first embodiment of a semiconductor device according to the invention shown in FIGS. 1 and 2 comprises a lead electrode 1 for connecting with a lead (not shown), a case electrode 5 having a convex wall section 5d at a periphery thereof and a semiconductor chip 3 having a rectification function and placed between the lead electrode 1 and the case electrode 5 through a bonding material 2, 2a. The case electrode 5 includes, in an area between an edge 3a of the semiconductor chip 3 and the convex wall section 5d, a first area 5b which is thinner than the thickness of an area of the case electrode 5 on which the semiconductor chip 3 is placed, and a second area 5c having a thickness which is thicker than that of the first area 5b. The first area 5b is formed so as to extend within a distance five times the thickness of the bonding material 2a bonding the semiconductor chip 3 to the case electrode 5 from the edge 3a of the semiconductor chip 3. In order to improve the heat radiation performance, this structure allows the semiconductor chip 3 to directly connect with the case electrode 5 through the bonding material 2a without any intermediate member. Normally, the lead electrode 1 and the case electrode 5 are formed by copper-based or iron-based metal. When these electrodes are formed, for example, of copper-based metal, their coefficients of linear thermal expansion are around 17 ppm/° C. On the other hand, the coefficient of linear thermal expansion of the semiconductor chip 3 is 3 ppm/° C. There is a large difference in the coefficients of linear expansion between the semiconductor chip 3 and the case electrode 5. The bonding material 2a between the semiconductor chip 3 and case electrode 5 deforms together with the case electrode 5 on a case electrode side thereof and deforms together with the semi-conductor chip 3 on a chip side thereof. Accordingly, the deformation of the bonding material 2a is suppressed by the semiconductor chip 3 on the semi-conductor chip side, which causes a large amount of distortion at an end of the bonding material 2a.

As described above, the case electrode 5 includes, in the area from the position at which the semiconductor chip 3 is placed to the convex wall section 5d, the first area 5b which is thinner than the area on which the semiconductor chip 3 is placed and the second area 5c which is thicker than the first area 5b. Therefore, it is possible to reduce the deformation of the bonding material 2a together with the case electrode 5. Furthermore, as described above, the first area 5b is formed so as to extend within the distance five times the thickness of the bonding material 2a bonding the semiconductor chip 3 to the case electrode 5 from the end 3a of the semiconductor chip 3. Therefore, a difference in the linear thermal expansion between the semiconductor chip 3 and case electrode 5 becomes small, even if cooling and heating occur repeatedly.

If the end of the first area 5b is not positioned at the same position as the end 3a of the semiconductor chip 3, when the semi-conductor chip 3 is bonded to the case electrode 5 through the bonding material 2a, since the case electrode 5 is longer than the semiconductor chip 3, the bonding material 2 sticks out of the end 3a of the semiconductor chip 3 and flows in a direction of the case electrode 5. However, in the present invention, since the end of the first area 5b is positioned at the same position as the end 3a of the chip 3, the flow of the bonding material 2a can be suppressed. Accordingly, it is possible to reduce the amount of the deformation of the bonding material 2a together with the case electrode 5. This reduces the thermal distortion at the end of the bonding material 2a and thereby extends the thermal fatigue life.

Furthermore, when a periphery 5a of the case electrode 5 and a heat radiation plate 6 are mechanically fixed together, deformation of the case electrode 5 produces stress on the semiconductor chip 3. At this time, the first area 5b has an effect of absorbing influences of the deformation of the case electrode 5 on the deformation of the semiconductor chip 3, and can thereby reduce the stress.

Furthermore, it is preferable that an area in which the semiconductor chip 3 is located is formed at a position not higher than the convex wall section 5d, and that the semiconductor chip 3 is placed within the thickness of the heat radiation plate 6, as shown in FIG. 1. With this structure, it is possible to improve the heat radiation performance.

An area surrounded by the convex wall 5b of the case electrode 5 is filled with an insulating material 4. The insulating material 4 is made of a soft rubber material. The soft rubber material has a rigidity of 1 MPa to 3 MPa at a normal temperature (25° C.) and 2 MPa to 4 MPa even at a high temperature (200° C.). This means that its physical properties do not deteriorate even at a high temperature, and, correspondingly, it can withstand long use. Furthermore, the insulating material itself has low rigidity. When the periphery 5a of the case electrode 5 and the heat radiation plate 6 are mechanically fixed together, the deformation of the case electrode 5 is transferred to the semiconductor chip 3 through the insulating material 4. However, since the insulating material 4 of the soft rubber material has low rigidity as described above, it is possible to reduce stress to be applied to the semiconductor chip 3 through the insulating material 4 due to the deformation of the case electrode 5. Organic rubber, such as resin typically has better mechanical strength than the soft rubber material, such as silicon rubber, at a normal temperature. However, such organic resin often loses its strength at a high temperature (150 to 200° C. or higher). Therefore, soft rubber material can extend the life of the insulating material in comparison with resin, etc.

Figure 3:
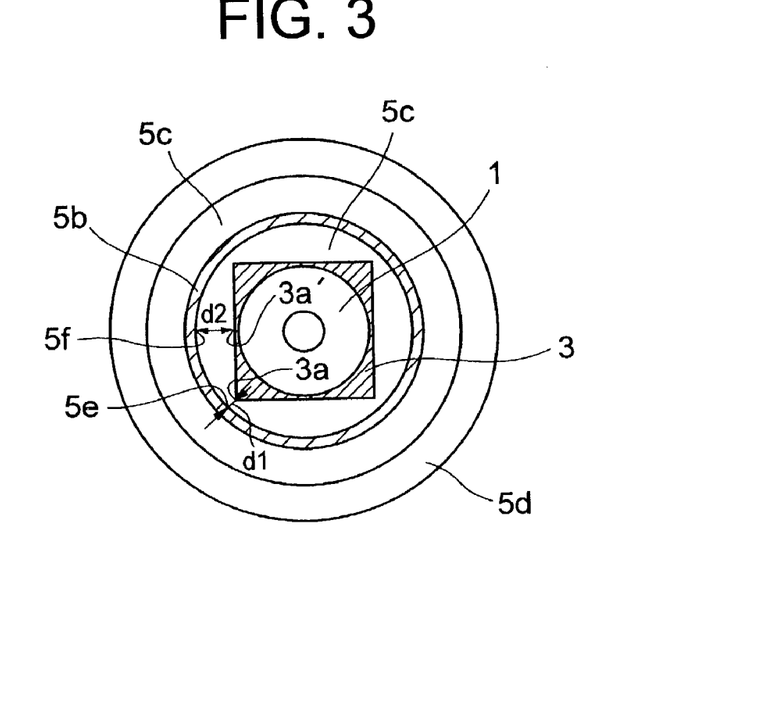
FIG. 3 is a top view of a second embodiment of the present invention in which the shape of the semiconductor chip is rectangular.

FIG. 3 is a top view of a second embodiment of the semiconductor device according to the present invention. In the second embodiment, a first distance d1 between the first end 3a of the semiconductor chip 3 and a corresponding first end 5e of the first area 5b is smaller than a second distance d2 between a second end 3a' of the semiconductor chip 3 and a corresponding second end 5f of the first area 5b. The second distance d2 is within five times the thickness of the bonding material 2a bonding the chip 3 to the case electrode 5. The first end 3a can be a point at which the distance from one end to the other end of the semiconductor chip 3 is the longest. The shape of the semiconductor chip 3 may be polygonal other that circular or rectangular. The amount of deformation of the bonding material 2 that deforms together with the case electrode 5 is proportional to an area of the bonding material 2 in contact with the case electrode 5. Providing a groove which corresponds to the first area 5b at a position where the area of the bonding material 2 in contact with the case electrode 5 can be reduced a great deal, while maintaining the electrical characteristic, makes it possible to make the most of the effect of the present invention.

Figure 4:
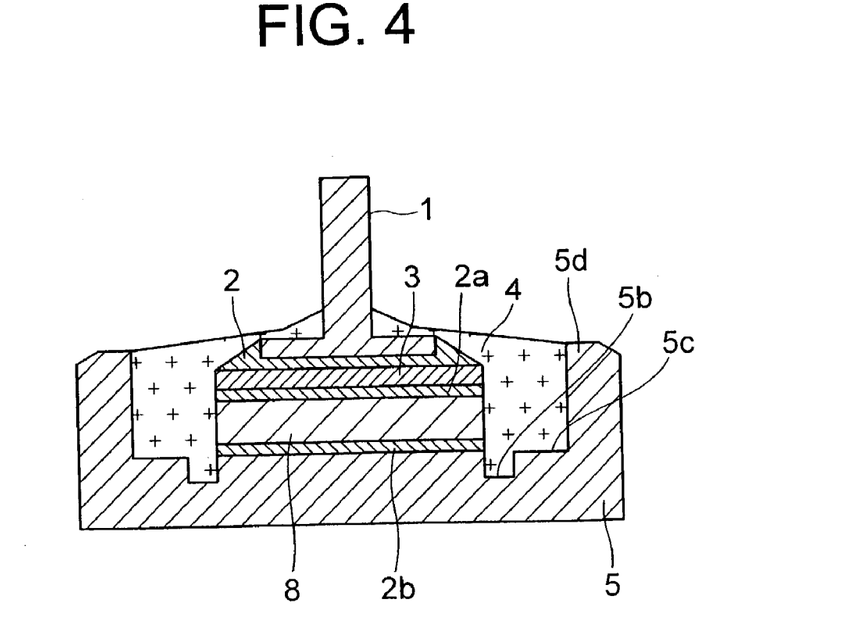
FIG. 4 is a vertical sectional view of a main part of a third embodiment of a semiconductor device according to the present invention.

In a third embodiment of the semiconductor device according to the present invention shown in FIG. 4, an intermediate member 8 having a coefficient of linear thermal expansion intermediate those of the semiconductor chip 3 and the case electrode 5 is interposed between the semiconductor chip 3 and the case electrode 5. The intermediate member 8 may be a three-layered structure of copper/iron alloy/copper, for example. With this structure, mechanical stress which is applied to the bonding material 2a and the semiconductor chip 3 is relieved and cracking of the semiconductor chip 3 is prevented.

The insulating material 4 seals the lead electrode 1, bonding material 2 between the lead electrode 1 and the chip 3, the semiconductor chip 3, the bonding material 2a between the semiconductor chip 3 and the intermediate member 8, the intermediate member 8, a bonding material 2b between the inter-mediate member 8 and the case electrode 5, and the case electrode 5. The insulating material 4 can be made of a soft rubber material, for example. As is the case in the first embodiment, to reduce thermal distortion produced by a difference in linear thermal expansions between the intermediate member 8 and the case electrode 5, the case electrode 5 includes, in an area from a position at which the semiconductor chip 3 is placed at the convex wall section 5d, the first area 5b which is thinner than the thickness of the area of the case electrode 5 on which the semiconductor chip 3 is placed and the second area 5c which is thicker than the first area 5b. The first area 5b is formed so as to extend within a distance five times the thickness of the bonding material 2b bonding the intermediate member 8 to the case electrode 5 from an end of the semiconductor chip 3.

Figure 5:
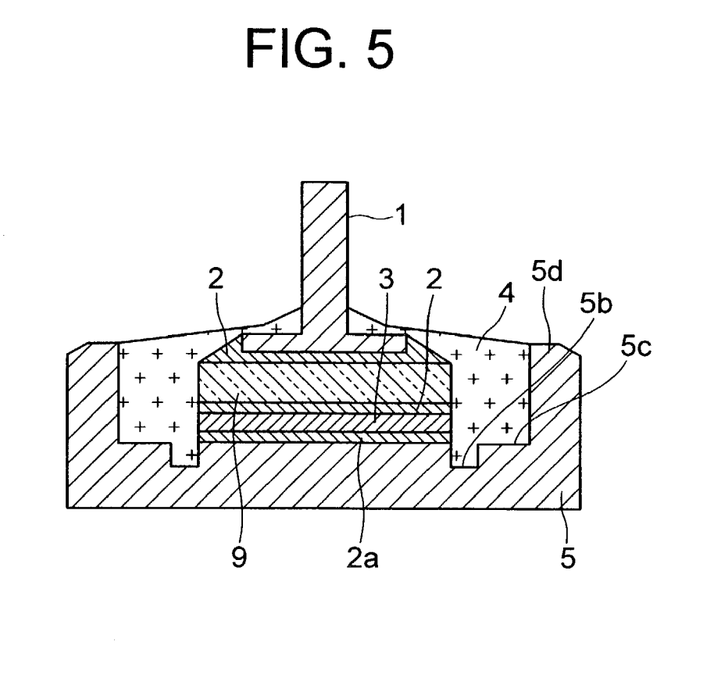
FIG. 5 is a vertical sectional view of a main part of a fourth embodiment of a semiconductor device according to the present invention.

In a fourth embodiment of a semiconductor device according to the present invention shown in FIG. 5, a metal plate 9 is provided between the lead electrode 1 and the semiconductor chip 3. The metal plate 9 is made of an invar (35% Ni—Fe alloy) material and has a thickness not less than 50% of the thickness of the semiconductor chip 3 in order to reduce stress on the semiconductor chip 3 produced by a difference in coefficients of linear thermal expansion. The invar has a coefficient of linear thermal expansion of 1.5 ppm/° C., while the semiconductor chip 3 has a coefficient of linear thermal expansion of 3 ppm/° C., which is larger than that of the metal plate 9. Increasing the thickness of the metal plate 9 relative to that of the semiconductor chip 3 makes it possible to reduce the difference in linear thermal expansion. Furthermore, increasing the thickness of the metal plate 9 also improves the capability to suppress deformation of the chip, and, therefore, it is to be expected that stress on the semiconductor chip 3 will also be reduced. Furthermore, since the semiconductor chip 3 is directly connected to the case electrode 5, it has an excellent heat radiation performance. In order to reduce thermal distortion produced by a difference in coefficients of linear thermal expansion between the semiconductor chip 3 and the case electrode 5, as in the case of the first embodiment, the case electrode 5 includes, in an area from a position at which the semiconductor chip 3 is placed at the convex wall section 5d, the first area 5b which is thinner than the thickness of the area of the case electrode 5 on which the semiconductor chip 3 is placed and the second area 5c which is thicker than the first area 5b. The first area 5b is formed so as to extend within a distance five times the thickness of the bonding material 2b bonding the intermediate member 8 to the case electrode 5 from an end of the semiconductor chip 3.

Figure 6:
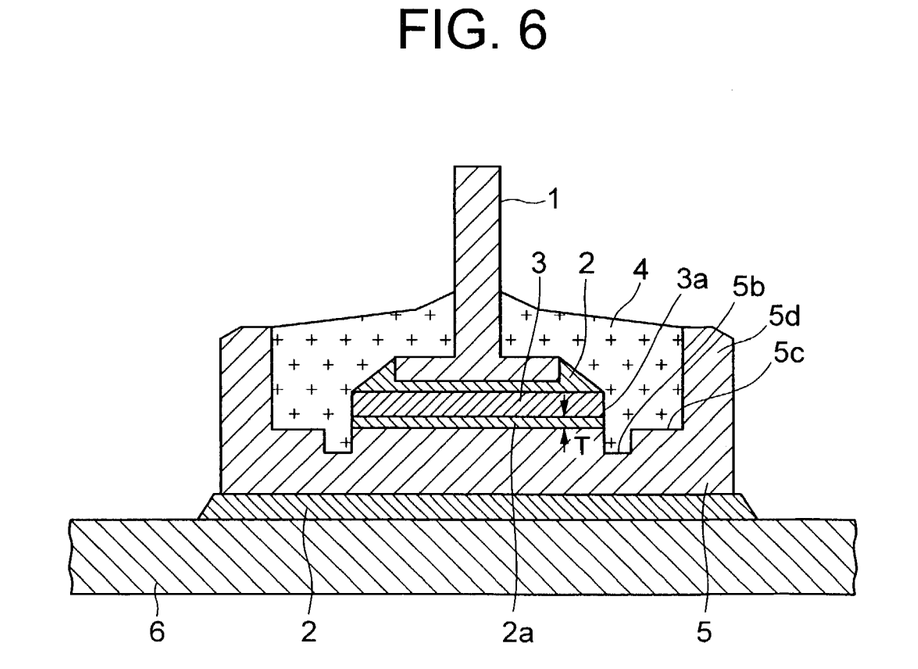
FIG. 6 is a vertical sectional view of a main part of a fifth embodiment of a semiconductor device according to the present invention.

In a fifth embodiment of a semiconductor device according to the present invention shown in FIG. 6, the case electrode 5 and the heat radiation plate 6 are fixed together through the bonding material 2. In comparison with a case in which the case electrode 5 is fixed into a hole in the heat radiation plate 6 having a smaller diameter than that of the case electrode 5 using a press-fitting system, it is to be expected that the amount of stress applied to the case electrode will be reduced.

Figure 7:
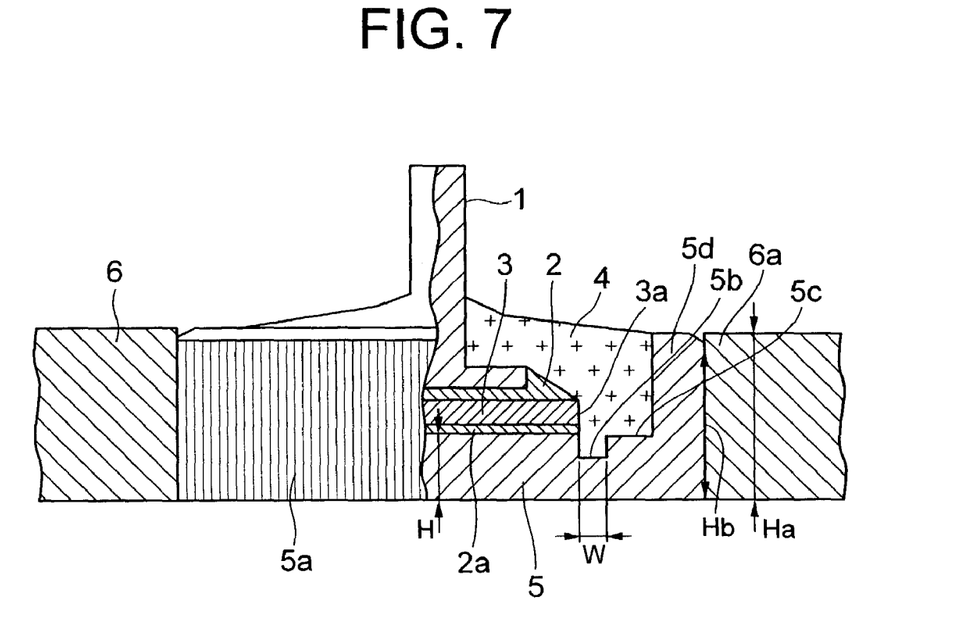
FIG. 7 is a vertical sectional view of a main part of a sixth embodiment of a semiconductor device according to the present invention.

A sixth embodiment of a semiconductor device according to the present invention shown in FIG. 7 is similar to the first embodiment. In the sixth embodiment, a height Hb of the convex wall 5d in contact with the heat radiation plate 6 is not greater than a thickness Ha of the heat radiation plate 6 placed on the peripheral side of the case electrode 5. With this structure, when the semiconductor device is mounted inside an engine room of an automobile, it is possible to prevent the case electrode 5 fixed to the heat radiation plate 6 from coming off due to external shock, etc.

Figure 8:
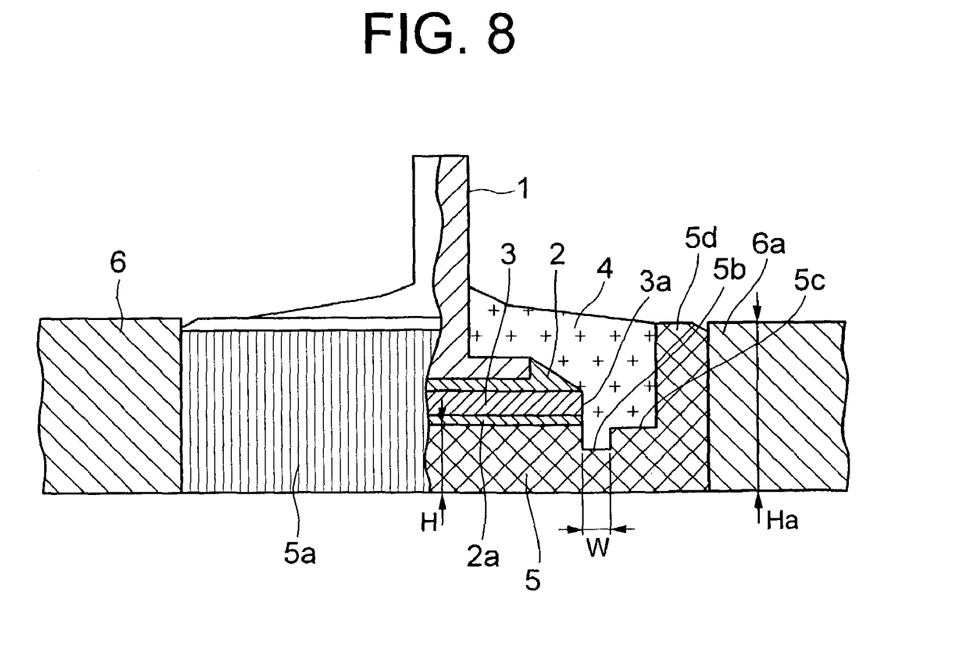
FIG. 8 is a vertical sectional view of a main part of a seventh embodiment of a semiconductor device according to the present invention.

A seventh embodiment of a semiconductor device according to the present invention shown in FIG. 8 is similar to the sixth embodiment. The seventh embodiment comprises the case electrode 5 being formed by zircon copper. Normally, the zircon copper has a yield stress value of 427 MPa, which is more than twice 207 Mpa of the yield stress value of pure copper. Therefore, it is possible to reduce an influence of deformation of the case electrode 5 on deformation of the semiconductor chip 3 when the periphery 5a of the case electrode 5 and heat radiation plate 6 are mechanically fixed according to a press-fit system.

Figure 9:
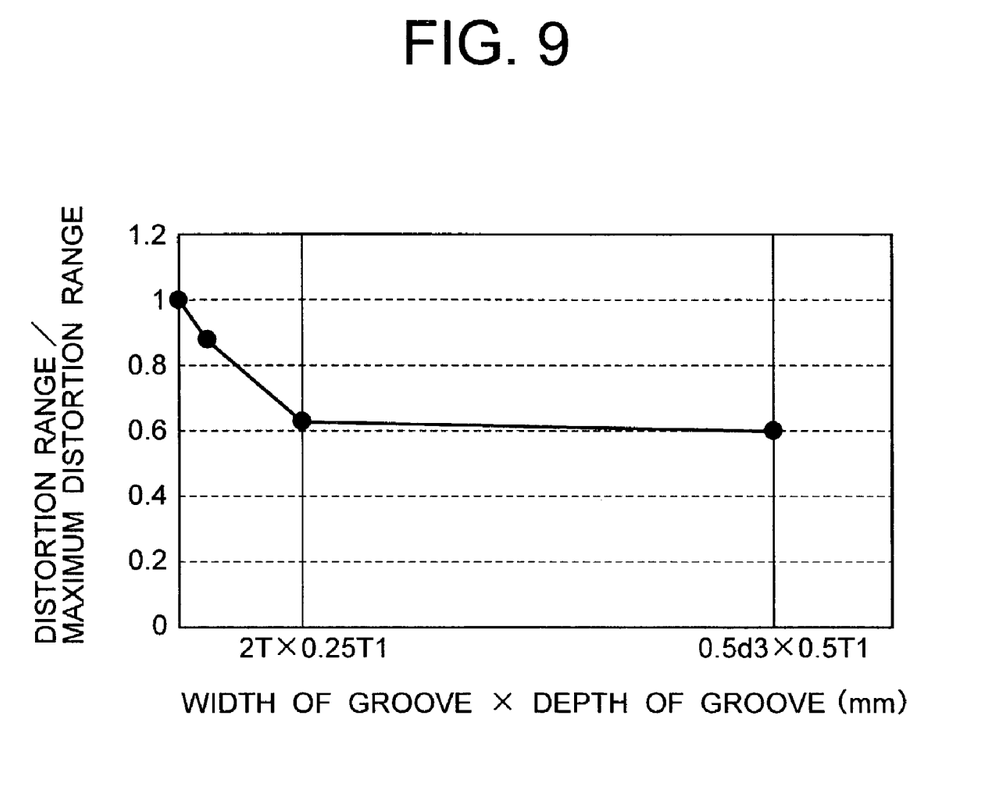
FIG. 9 is a graph showing a relationship between a depth×a width of a groove provided on a case electrode of the semiconductor device and distortion range/maximum distortion range in cooling relative value.

A graph shown in FIG. 9 shows a relationship between width×depth of the first area which is a groove provided on the case electrode 5 and a distortion range/maximum distortion range at a predetermined temperature obtained by numerical calculations.

Referring to FIGS. 1 and 9, the width W of the groove is not less than 50% of the thickness T of the bonding material 2a bonding the chip 3 to the case electrode 5. Providing the groove may affect rigidity and current-carrying capacity of the case electrode 5, and, therefore, it is necessary to determine the width W of the groove quantitatively. The width W of the groove from which a great effect of the groove can be expected is not less than twice the thickness T of the bonding material 2a and is not more than 50% of a distance d3, which is the distance from a position of the case electrode 5, corresponding to the outer end 3a of the semiconductor chip 3 closest to the convex wall 5d, to the convex wall 5d.

Furthermore, the width according to the position of the groove is not more than 90% of the distance d3 from the position of the case electrode 5 corresponding to the outer end 3a of the semiconductor chip 3 closest to the convex wall 5d. This also makes it possible to restrict the width according to the position of the groove and improve the effect of the groove.

The depth T3 of the groove, which is the thickness T3 of the first area 5a from a plane, on which the semiconductor chip 3 is mounted, to a bottom thereof, is not less than 25% of the thickness T1 of the area of the case electrode 5 on which the semiconductor chip 3 is mounted and is not more than 50% of the thickness T1.

As can be appreciated from the graph shown in FIG. 9, a sufficient effect can be obtained when the width and depth of the groove are 2T and 0.25T1. A greater width and depth than these will make no significant difference.

As described above, according to the invention, a semiconductor device is provided which is capable of preventing cracking of a semiconductor chip caused by a difference in mutual thermal deformation between a case electrode and the semiconductor chip, which are electrically connected with each other by means of a bonding material, and improving a heat radiation performance of the semiconductor chip.

What is claimed is:
1. A semiconductor device comprising:
   a lead electrode to connect with a lead;
   a case electrode having a convex wall section at a periphery thereof; and
   a semiconductor chip having a rectification function placed between said lead electrode and said case electrode and bonded to them by a bonding material,
   wherein said case electrode includes, in an area between an edge of said semiconductor chip and said convex wall section, a first region which has a height less than the height of a mounting region of said case electrode on which said semiconductor chip is placed and a second region having a height which is greater than that of said first region but less than the height of a top of the convex wall section, wherein the first and second regions form a groove between said mounting region and said convex wall section, and said first region is formed so as to have a width extending within a distance five times the thickness of the bonding material bonding the semiconductor chip to the case electrode from the edge of the semiconductor chip.

2. A semiconductor device according to claim 1, wherein a first distance between a first edge of said semiconductor chip and a corresponding first end of said first region is smaller than a second distance between a second edge of said semiconductor chip and a corresponding second end of said first region, and said second distance is not more than 5 times the thickness of said bonding material bonding said semiconductor chip to said case electrode.

3. A semiconductor device according to claim 1, wherein said mounting region of said case electrode on which said semiconductor chip is placed is positioned at a level not higher than the height of the top of said convex wall section.

4. A semiconductor device according to claim 1, wherein the width of said first region is not less than 50% of the thickness of said bonding material bonding said semiconductor chip to said case electrode.

5. A semiconductor device according to claim 1, wherein the width of said first region is not more than 90% of a distance from a position of the case electrode corresponding to an outer edge of the semiconductor chip which is the closest to said convex wall section.

6. A semiconductor device according to claim 1, wherein a depth of the first region of said case electrode is not less than 30% of the height of the mounting region of the case electrode on which the semiconductor chip is placed.

7. A semiconductor device according to claim 1, wherein a height of a part of said convex wall section in contact with a heat radiation plate, which is placed peripheral to said semiconductor device, is not more than a height of the heat radiation plate.

8. A semiconductor device according to claim 1, further comprising an insulating material filled in an area surrounded by the convex wall section of said case electrode, said insulating material being made of a soft rubber material.

9. A semiconductor device according to claim 1, wherein said case electrode comprises zircon copper.

10. A semiconductor device comprising:
a lead electrode to connect with a lead;
a semiconductor chip having a rectification function placed on said lead electrode through a bonding layer; and
a case electrode placed under said semiconductor chip through a bonding material,
wherein said case electrode includes:
a convex wall section surrounding a periphery thereof,
a mounting region formed inside the convex wall section, on which said semiconductor chip is placed,
a first region formed outside said mounting region on which said semiconductor chip is placed and having a height which is less than that of said mounting region on which said semiconductor chip is placed, and
a second region formed between said first region and said convex wall section, a height of which is greater than that of said first region and less than a height of a top of the convex wall section,
wherein the first and second regions form a groove between said mounting region and said convex wall section, and
wherein a distance between an edge of said semiconductor chip which is the closest to said convex wall section and said first region is not more than five times a thickness of said bonding layer bonding said semiconductor chip to said case electrode.

11. A semiconductor device comprising:
a lead electrode to connect with a lead;
a case electrode having a convex wall section at a periphery thereof; and
a semiconductor chip having a rectification function placed between said lead electrode and said case electrode and bonded to them by a bonding material,
wherein said case electrode includes, in an area between an edge of said semiconductor chip and said convex wall section, a first region which has a height lower than the height of a mounting region of said case electrode on which said semiconductor chip is placed and a second region having a height which is greater than that of said first region but less than the height of a top of the convex wall section, wherein the first and second regions form a groove between said mounting region and said convex wall section, and
wherein said second region is located between said first region and said convex wall section and at a level lower than that of said mounting region of said case electrode on which said semiconductor chip is placed.

12. A semiconductor device according to claim 1, wherein said second region is located at a level lower than that of said mounting region of said case electrode on which said semiconductor chip is placed.

13. A semiconductor device comprising:
a lead electrode to connect with a lead;
a case electrode having a convex wall section at a periphery thereof;
a semiconductor chip having a rectification function placed between said lead electrode and said case electrode and bonded to them by a bonding material; and
means, located between an edge of the semiconductor chip and said convex wall section of the case electrode, for reducing heat distortion generated between the semiconductor chip and the case electrode, wherein said means includes a groove formed in the case electrode between a mounting region of the case electrode on which the semiconductor chip is mounted and said convex wall section,
wherein said groove is formed by a first region of the case electrode, located adjacent to the mounting region of the case electrode and having a height lower than a height of the mounting region, and a second region of the case electrode located between the first region and the convex wall section and having a height greater than the height of the first region but lower than the height of a top of the convex wall section.

14. A semiconductor device according to claim 13, wherein the second region is located at a level lower than that of the mounting region on which said semiconductor chip is placed.

* * * * *